(12) United States Patent
Khanna et al.

(10) Patent No.: US 7,477,517 B2
(45) Date of Patent: Jan. 13, 2009

(54) INTEGRATED HEAT SPREADER AND EXCHANGER

(75) Inventors: Vijayeshwar D. Khanna, Millwood, NY (US); Alok K. Lohia, Dallas, TX (US); Gerard McVicker, Stormville, NY (US); Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 11/668,097

(22) Filed: Jan. 29, 2007

(65) Prior Publication Data
US 2008/0180914 A1    Jul. 31, 2008

(51) Int. Cl.
*H05K 7/20* (2006.01)
(52) U.S. Cl. .................. 361/704; 361/689; 361/699; 165/80.4; 165/185; 29/890.03; 257/714
(58) Field of Classification Search ............ 361/695, 361/699, 702, 704, 719; 165/80.4, 185, 104.33, 165/104.21, 104.26; 257/713–715, 722, 257/E23.098; 415/178; 29/890.03, 445, 29/462, 469
See application file for complete search history.

(56) References Cited

U.S. PATENT DOCUMENTS

| | | | | |
|---|---|---|---|---|
| 5,083,373 A * | 1/1992 | Hamburgen | ............ | 29/890.03 |
| 5,335,722 A * | 8/1994 | Wu | ............ | 165/122 |
| 5,345,107 A * | 9/1994 | Daikoku et al. | ............ | 257/717 |
| 5,705,850 A * | 1/1998 | Ashiwake et al. | ............ | 257/714 |
| RE35,721 E * | 2/1998 | Daikoku et al. | ............ | 165/185 |
| 5,774,334 A * | 6/1998 | Kawamura et al. | ............ | 361/699 |
| 6,019,165 A * | 2/2000 | Batchelder | ............ | 165/80.3 |
| 6,064,572 A * | 5/2000 | Remsburg | ............ | 361/700 |
| 6,410,982 B1 * | 6/2002 | Brownell et al. | ............ | 257/714 |
| 6,876,550 B2 * | 4/2005 | Sri-Jayantha et al. | ............ | 361/699 |
| 7,188,667 B2 * | 3/2007 | Schultz | ............ | 165/185 |
| 7,262,967 B2 * | 8/2007 | Crocker et al. | ............ | 361/699 |
| 7,280,357 B2 * | 10/2007 | Tomioka et al. | ............ | 361/699 |
| 7,400,503 B2 * | 7/2008 | Crocker et al. | ............ | 361/699 |
| 2004/0114327 A1 | 6/2004 | Sri-Jayantha et al. | | |
| 2007/0139881 A1 * | 6/2007 | Ouyang | ............ | 361/689 |

\* cited by examiner

*Primary Examiner*—Jayprakash N Gandhi
*Assistant Examiner*—Courtney L Smith
(74) *Attorney, Agent, or Firm*—Cantor Colburn LLP; Casey August

(57) ABSTRACT

Disclosed is an integrated active heat spreader and exchanger. The heat spreader cum exchanger includes a housing with a conductive heat spreader therein. A spreader plate of the heat spreader is in thermal contact with a microprocessor chip to be cooled and a plurality of spreader fins extending from the spreader plate. A membrane connects the heat spreader and the housing, sealing an interface between the heat spreader and the housing. A top plate, including a plurality of top plate fins, is disposed in the housing. A pump is located between the top plate fins and the spreader fins and urges fluid across the spreader fins and conducts heat from the spreader fins. The top plate fins conduct heat from the fluid and into a heat sink in thermal contact with the top plate. A heat sink plate conducts heat into heat sink fins where the heat is dissipated.

5 Claims, 2 Drawing Sheets

INTEGRATED HEAT SPREADER AND EXCHANGER

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to electronic components, and particularly to cooling devices for microprocessors.

2. Description of Background

A typical air cooling scheme for high power microprocessors includes a heat sink in close contact with a microprocessor chip to be cooled. The heat sink conducts heat from the chip to heat sink fins where the heat is transferred to the atmosphere by convection. A thermal interface material (TIM) is used to achieve optimal thermal contact between the chip and the heat sink. The TIM has a relatively poor thermal conductivity (about 4 W/mK), however, so it is desirable to minimize its thickness to optimize the thermal contact between the chip and the heat sink. TIM material is typically made of conducting metal oxide particles of a given size (50 um) embedded in an oil-like medium. New generation of TIM materials behave more like a soft solid rather than high viscosity paste.

To be capable of dissipating the large amount of heat generated by the chips, the heat sink fins are made larger, and are often significantly larger than the chip itself. In such a case, the heat sink utilizes a heat spreader, typically made from a highly conductive metal such as copper. The heat sink having large fins and a heat spreader is often too heavy to be supported directly by the chip it is cooling, so the heat sink is attached to, and at least partially supported by, the circuit board to which the chip is attached. To accommodate different expansion rates between the chip and heat sink during power on/power off cycles, the gap between heat sink and chip must be controlled with elaborate mechanical system design. In present designs, in order to maintain minimum gap the heat sink is pressed against the particles contained in a TIM material with a preload of about 50 to 100 N. Particles of size 50 um help to maintain a minimum gap of about 50 um. The preload is generally not desirable and can be detrimental to the electronic components such as solder balls that support the chip. More importantly, cyclic changes in the mechanical clearance between the chip and the heat spreader can result in a pumping action of TIM that can lead to voids being formed in the TIM and eventually to chip failure. In the case of TIM materials that are not paste-like but have a viscoplastic characteristics the cyclic changes in mechanical clearance can lead to fatigue failure of a thermal interface.

What is needed is a heat sink with a heat spreader that is capable of dissipating the necessary amount of heat, and which includes a minimal thickness of TIM at the heat sink interface to the chip.

SUMMARY OF THE INVENTION

The shortcomings of the prior art are overcome and additional advantages are provided through the provision of an integrated active heat spreader and exchanger for a microprocessor chip. The heat spreader cum exchanger includes a housing having a conductive heat spreader disposed therein. The heat spreader includes a spreader plate in thermal contact with a microprocessor chip to be cooled and a plurality of spreader fins extending from the spreader plate. A membrane connects the heat spreader and the housing, the membrane sealing the interface between the heat spreader and the housing. Additionally, a top plate is disposed in the housing. The top plate includes a plurality of top plate fins that extend from the top plate toward the spreader fins.

A pump is disposed in the housing between the top plate fins and the spreader fins. The pump urges fluid across the spreader fins where the fluid conducts heat from the spreader fins. The fluid continues across the top plate fins, the top plate fins conducting heat from the fluid. A heat sink is in thermal contact with the top plate and includes a plurality of heat sink fins extending from a heat sink plate. The heat sink plate conducts heat from the top plate into the heat sink fins and the heat is dissipated from the heat sink fins by convection.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which is capable of dissipating heat from a microprocessor chip with a structure that minimizes the thickness of a TIM interface between the chip and a heat spreader. Minimizing the thickness of the interface reduces a thermal resistance of the interface and eliminates a pumping action that can lead to chip failure.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
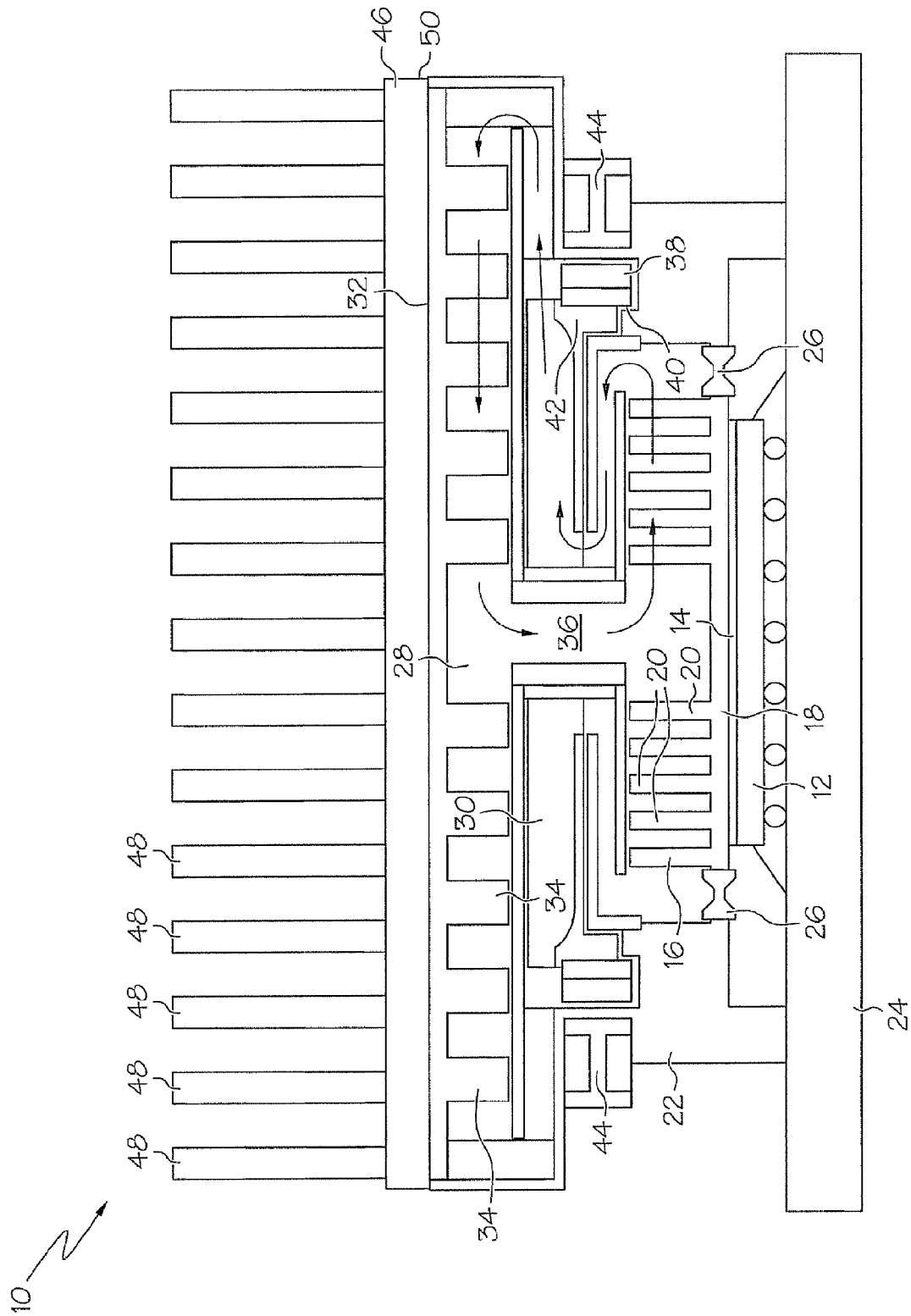
FIG. 1 is a cross-sectional view of one example of an integrated active heat spreader and exchanger device.

Turning now to the drawings in greater detail, it will be seen that in FIG. 1 there is an integrated active heat spreader and exchanger device 10. The device 10 is attached to a microprocessor chip 12 by a thin layer of thermal interface material (TIM) 14 at a heat spreader 16. The heat spreader 16 is made of a conductive material and comprises a spreader plate 18 with a plurality of spreader fins 20 extending from the plate 18. In one embodiment, the heat spreader 16 is made of copper. In some embodiments, the heat spreader 16 may be permanently attached to the chip 12 by use of thermal epoxies, Indium/Silver based metal compounds or eutectic solder. Alternatively, the heat spreader 16 can be formed of silicon to remove a thermal mismatch with the chip 12.

Figure 2:
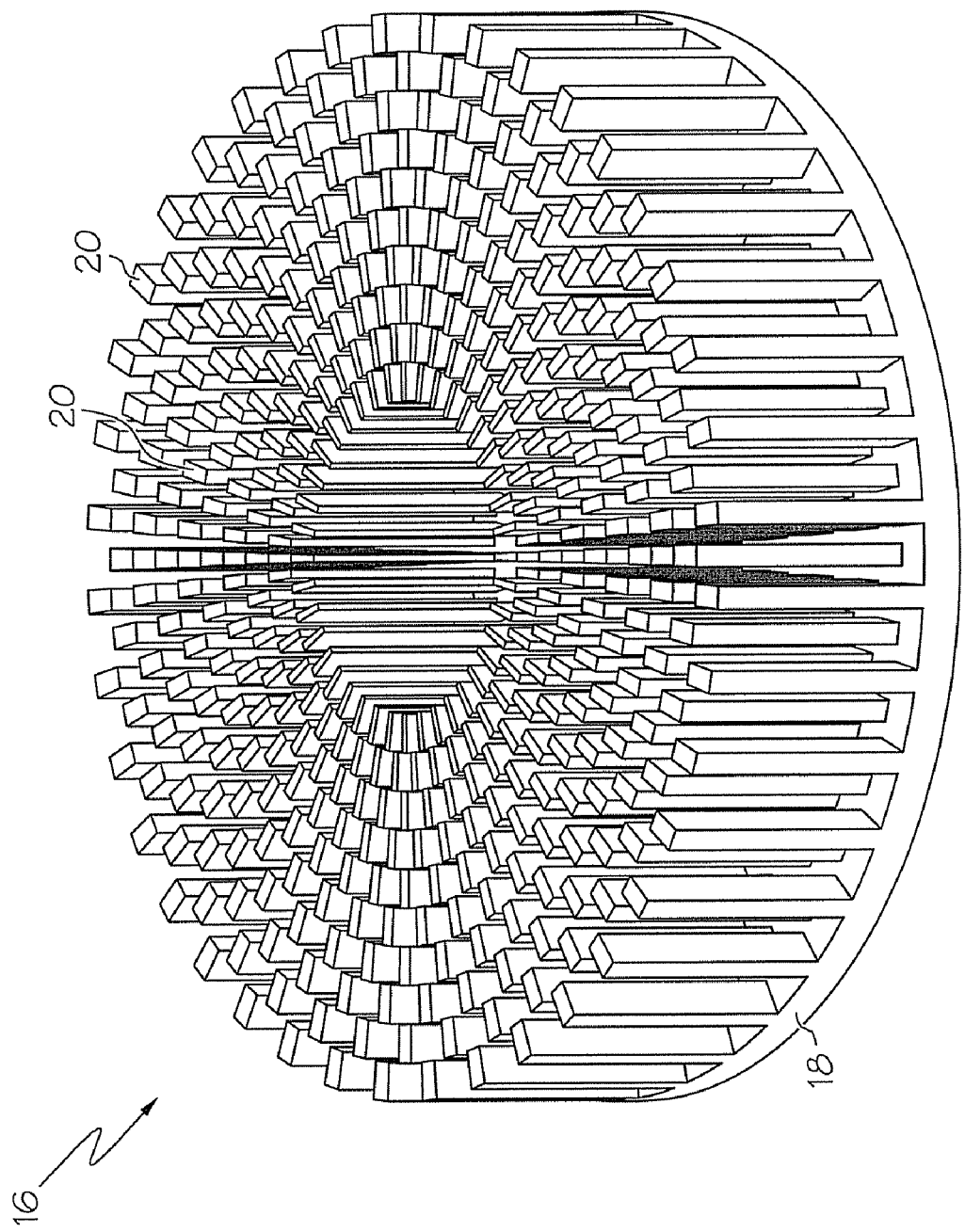
FIG. 2 is a detail view of an example of a heat spreader of the device of FIG. 1.

The heat spreader 16 conducts heat from the chip 12 into the spreader plate 18, and into the spreader fins 20. The size and thickness of the heat spreader 16 can vary based on the application, but in one embodiment the spreader plate 18 is approximately 1 mm thick and the spreader fins 20 are approximately 5 mm tall. As shown in FIG. 2, the heat spreader 16 in this embodiment is circular in shape with the plurality of spreader fins 20 aligned in a radial direction, but the heat spreader 16 can be another shape, for example square or rectangular.

Returning to FIG. 1, the heat spreader 16 is disposed within a housing 22. In this embodiment, the housing 22 is connected to a circuit card 24, to which the chip 12 is mounted, to provide support for the size and weight of the device 10. The heat spreader 16 is connected to the housing 22 via a compliant membrane 26. The compliant membrane 26 seals the interface between the housing 22 and the heat spreader 16 creating a chamber 28 within the housing 22. Additionally, the utilization of the compliant membrane 26 allows heat spreader 16 to move with the chip 12 as it expands and contracts during on/off cycles.

The chamber 28 contains cooling fluid, the flow of which is driven by a pump 30 disposed in the housing 22. In this embodiment, the pump 30 is a centrifugal pump with its axis of rotation substantially perpendicular to the spreader plate 18. The housing 22 also includes a top plate 32 with a plurality of internal fins 34 extending into the chamber 28. The pump 30 is disposed in the chamber 28 between the spreader fins 20 and the internal fins 34, with a small clearance between the spreader fins 20 and the pump 30. The pump 30 draws fluid through a center portion 36 of the chamber 28. The fluid flow through the plurality of spreader fins 20, conducting heat from the spreader fins 20. The heated fluid flows through the plurality of internal fins 34, where the internal fins 34 conduct heat from the fluid and into the top plate 32.

To drive the pump 30, a ring of alternating polarity permanent magnets 38 are connected to a circumference 40 of a pump rotor 42. A set of armature coils 44 are placed on an exterior of the housing 22 at substantially the same axial position as the magnets 38. When a switched DC current is forced through the coils 44, the rotor 42 is forced into motion.

The heat conducted into the top plate 32 is conducted through an adjacent heat sink plate 46 and into a plurality of heat sink fins 48 that extend from the heat sink plate 46. In one embodiment, the top plate 32 and heat sink plate 46 are connected via a second TIM layer 50. In an alternative embodiment, the top plate 32 and heat sink plate 46 are integral with each other, therefore the second TIM layer 50 is not utilized. To dissipate heat into the atmosphere, a volume of air is moved across the heat sink fins 48, in some embodiments by a fan (not shown), and the heat is dissipated into the air by convection.

The structure of the device 10 allows the heat spreader 16 to move relative to the rest of the device 10. Because the heat spreader 16 can move relative to the device 10 and with the chip 12, the TIM layer 14 can be thinner, minimizing thermal resistance of the TIM layer 14 and minimizing a pumping action caused by the chip 12 moving relative to the heat spreader 16.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An integrated active heat spreader and exchanger for a microprocessor chip comprising:
   a housing;
   a conductive heat spreader disposed in the housing, the heat spreader including a spreader plate in thermal contact with a microprocessor chip to be cooled and a plurality of spreader fins extending from the spreader plate;
   a membrane connecting the heat spreader and the housing, the membrane sealing the interface between the heat spreader and the housing;
   a top plate disposed in the housing, the top plate including a plurality of top plate fins extending from the top plate toward the plurality of spreader fins;
   a pump disposed in the housing between the top plate fins and the spreader fins, the pump urging fluid across the spreader fins where the fluid conducts heat from the spreader fins, the fluid continuing across the top plate fins, the top plate fins conducting heat from the fluid; and
   a heat sink in thermal contact with the top plate, the heat sink including a plurality of heat sink fins extending from a heat sink plate, the heat sink plate conducting heat from the top plate into the heat sink fins, the heat dissipated from the heat sink fins by convection.

2. The heat spreader and exchanger of claim 1 wherein the pump is a centrifugal pump.

3. The heat spreader and exchanger of claim 2 wherein the centrifugal pump is driven by a ring of alternating polarity magnets disposed at a circumference of a pump rotor and a set of armature coils disposed on an exterior of the housing, such that when a switched DC current is forced through the armature coils the pump rotor is forced to rotate.

4. The heat spreader and exchanger of claim 1 wherein the spreader plate is thermally connected to the microprocessor chip to be cooled by a layer of thermal interface material.

5. The heat spreader and exchanger of claim 1 wherein the top plate is thermally connected to the heat sink by a layer of thermal interface material.

* * * * *